(12) United States Patent
Levy et al.

(10) Patent No.: US 6,987,250 B2
(45) Date of Patent: Jan. 17, 2006

(54) CONTROL CIRCUIT FOR KITCHEN APPLIANCES

(75) Inventors: William Levy, Hopedale, MA (US); Robert A. Sherwood, El Paso, TX (US); James J. Tracy, Attleboro, MA (US)

(73) Assignee: The Holmes Group, Inc., Milford, MA (US)

( * ) Notice: Subject to any disclaimer, the term of this patent is extended or adjusted under 35 U.S.C. 154(b) by 78 days.

(21) Appl. No.: 10/858,223

(22) Filed: Jun. 1, 2004

(65) Prior Publication Data

US 2004/0217108 A1 Nov. 4, 2004

Related U.S. Application Data

(63) Continuation-in-part of application No. 10/444,300, filed on May 23, 2003, now Pat. No. 6,812,437, which is a continuation of application No. 09/844,995, filed on Apr. 27, 2001, now Pat. No. 6,570,139.
(60) Provisional application No. 60/200,586, filed on Apr. 28, 2000.

(51) Int. Cl.
*H05B 1/02* (2006.01)

(52) U.S. Cl. .................. 219/507; 219/508; 219/506; 219/483; 392/373; 392/383
(58) Field of Classification Search ................ 219/494, 219/497, 501, 506–508, 511; 383/360–364, 383/373–380, 385, 370
See application file for complete search history.

(56) References Cited

U.S. PATENT DOCUMENTS

| 1,528,300 A | 3/1925 | Noonan |
| 4,313,051 A | 1/1982 | Aoshima |
| 4,345,145 A | 8/1982 | Norwood |
| 4,365,141 A | 12/1982 | Weiss |

(Continued)

OTHER PUBLICATIONS

Holmes, "Twin Window Fan", HAWF–2095, Holmes Product Corporation, 1997.

Holmes, "Accuset™ Warm Mist Humidifier", HAWF–5700, Holmes Product Corporation, 1998.

*Primary Examiner*—Mark Paschall
(74) *Attorney, Agent, or Firm*—Hoffmann & Baron, LLP; Francis E. Marino

(57) ABSTRACT

An electronic control circuit for use with a heater, a fan, a humidifier, a cooking apparatus, or any device utilizing a power mode switch and a condition sensor, and time-automated switching of modes of operation. The circuit includes a single control switch to manually set power output, to set a value for automatically comparing and responding to a sensed condition, and to set a time-automated sequence of operational modes. The circuit includes a microprocessor, preferably an application-specific integrated circuit, to provide circuit logic. The single control switch, preferably a push-button switch, selects a mode of operation. The circuit includes a thermistor or humidity sensor. The unit responds to the sensed condition, in accordance with the temperature/humidity value set by the control switch. The unit bypasses sensor operation in manual mode. In timed mode, a manual or automatic mode operates for selected time, followed by an automatic mode or powering off.

38 Claims, 12 Drawing Sheets

U.S. PATENT DOCUMENTS

| | | |
|---|---|---|
| 4,551,590 A | 11/1985 | Mahon |
| 4,566,802 A | 1/1986 | Koehler |
| 4,644,137 A | 2/1987 | Asahi et al. |
| 4,668,878 A | 5/1987 | Wyss |
| 4,674,890 A | 6/1987 | Kojima et al. |
| 4,687,910 A | 8/1987 | Aoshima et al. |
| 4,695,683 A | 9/1987 | Wingler et al. |
| 4,695,710 A | 9/1987 | Yamashita et al. |
| 4,711,988 A | 12/1987 | Thaler et al. |
| 4,749,874 A | 6/1988 | Meisner et al. |
| 4,764,715 A | 8/1988 | Kowalewski et al. |
| 4,789,761 A | 12/1988 | Malone et al. |
| 4,835,349 A | 5/1989 | Weber |
| 4,841,496 A | 6/1989 | Adams et al. |
| 4,857,758 A | 8/1989 | Rigazio et al. |
| 4,959,512 A | 9/1990 | Cole et al. |
| 5,191,231 A | 3/1993 | Berry |
| 5,258,656 A | 11/1993 | Pawlick |
| 5,430,598 A | 7/1995 | Rodolfo et al. |
| 5,467,423 A | 11/1995 | Jakubowski |
| 5,529,726 A | 6/1996 | Glenn |
| 5,558,086 A | 9/1996 | Smith et al. |
| 5,596,552 A | 1/1997 | Lim |
| 5,615,604 A | 4/1997 | Chenglin |
| 5,660,605 A | 8/1997 | Chan et al. |
| 5,771,207 A | 6/1998 | Muroi et al. |
| 5,792,390 A | 8/1998 | Marino |
| 5,834,718 A | 11/1998 | Amonett |
| 6,104,602 A | 8/2000 | Morris et al. |
| 6,191,393 B1 | 2/2001 | Park |
| 6,229,507 B1 | 5/2001 | Nakamura et al. |
| 6,362,459 B1 | 3/2002 | Schmidt |
| 6,498,323 B1 | 12/2002 | Robertson, Jr. et al. |
| 6,573,483 B1 | 6/2003 | DeCobert et al. |
| 6,730,889 B1 | 5/2004 | Jones-Lawlor et al. |

CONTROL CIRCUIT FOR KITCHEN APPLIANCES

PRIORITY APPLICATIONS

This application is a continuation-in-part of U.S. patent application Ser. No. 10/444,300, filed on May 23, 2003, which is a continuation of U.S. Pat. No. 6,570,139, issued on May 27, 2003. This application also claims the benefit of U.S. Provisional Application No. 60/200,586 filed on Apr. 28, 2000.

BACKGROUND OF THE INVENTION

1. Field of the Invention

The present invention relates to an improved electronic control circuit, and more particularly, to an electronic control circuit which provides the functions of both a multi-position power switch and a sensor device within a single control switch for one-touch operation of a cooking apparatus.

2. Description of Prior Art

Presently available electric space heaters, electric fans, and cooking apparatus for domestic use are generally provided with at least two control components. The first control component is a multi-position power switch to select a proper setting, e.g. off/high/medium/low. The second control component is a thermostat to de-energize the device when a predetermined, pre-set temperature value is achieved. Likewise currently available humidifiers are provided with a similar multi-position power switch and, rather than a thermostat, are provided with a humidistat to sense when a predetermined, pre-set humidity level is achieved.

A slow-cooker is a cooking apparatus that typically utilizes at least two control components. The first control component is typically a simple ON/OFF switch. The second control component is typically a multi-position switch to select an operating power to a heating element, e.g. high/low. Alternatively, the second control component is a timer in the form of a multi-position switch, e.g. 4 hours/6 hours/8 hours.

The present multi-position power switches, mechanical thermostats/humidistats and timers are expensive, unreliable, and mechanically complex. Additionally, these components constitute a major portion of the cost and complexity in making and using low cost heaters, fans, humidifiers, and cooking apparatus. Furthermore, the mechanics of these components tend to render them the most oft failed components in the device. More specifically, each component requires a control knob and individual wiring connections, which are labor intensive and points of potential failure.

SUMMARY OF THE INVENTION

The present invention, which addresses the needs of the prior art, relates to an electronic control circuit which provides the functions of both a multi-position power switch and a sensor device within a single control switch for one-touch operation of a cooking apparatus.

A cooking apparatus formed in accordance with the present invention includes a cooking unit, for holding food which is being prepared, a heating element in thermal contact with the cooking unit, and an electronic control circuit which is electrically coupled to the heating element, and adapted to provide power thereto. The electronic control circuit includes at least one of a temperature sensor, for sensing a temperature at the cooking unit, and a clock. The temperature sensor is in thermal contact with the cooking unit. The electronic control circuit further includes a single control switch to turn on operating power to the cooking apparatus and to select a mode of operation from a group of modes available. The group of modes includes at least one of a manual mode, a timed mode, and an automatic mode. The single control switch selects a pre-determined power level of operation in manual mode, or a pre-set time interval in timed mode, or a pre-set temperature value in automatic mode.

The electronic control circuit operating in the automatic mode includes the temperature sensor and further includes means for comparing the pre-set temperature value to the temperature sensed at the cooking unit in automatic mode, providing power to the heating element to substantially achieve the pre-set temperature value and terminating power to the heating element when the pre-set temperature value is substantially attained. The electronic control circuit that includes the timed mode includes the clock for monitoring and comparing actual elapsed time to the pre-set time interval in timed mode. The timed mode includes a first mode of operation and a second mode of operation. The first mode of operation operates until the actual elapsed time is substantially equal to the pre-set time interval, and the second mode of operation commences when the actual elapsed time is substantially equal to the pre-set time interval.

The first mode of operation is preferably one of the manual and automatic modes and the second mode of operation is preferably one of the manual and automatic modes, or a power off mode, whereby power is terminated to the heating element.

The cooking apparatus formed in accordance with the present invention may include one of a slow cooker, electric griddle, a deep fryer, and a roaster oven. The slow cooker preferably includes a heating unit, wherein the cooking unit is adapted to fit at least partially within the heating unit.

Preferably, the electronic control circuit includes an application-specific integrated circuit to control power to the heating element and illuminate indicia associated with the mode of operation selected. Further, the single control switch is preferably a push-button switch.

The present invention is also directed to a method of operating a cooking apparatus. The cooking apparatus includes a cooking unit, a heating element in thermal contact with the cooking unit, and an electronic control circuit. The electronic control circuit is electrically coupled to the heating element and adapted to provide power thereto, and includes at least one of a temperature sensor for sensing a temperature at the cooking unit and a clock for measuring actual elapsed time. The electronic control circuit also includes a single control switch. The method includes the steps of actuating the single control switch to turn the cooking apparatus on and off and to select a mode of operation from a group of modes including at least one of a manual mode and an automatic mode and a timed mode. Actuating the single control switch in the manual mode selects an operating power level. Actuating the single control switch in the automatic mode selects a pre-set temperature value. Actuating the single control switch in timed mode selects a pre-set time interval for operating the apparatus during the pre-set time interval either at a selected operating power level in manual mode of operation or at a pre-set temperature value in automatic mode of operation.

When in the manual mode, the method includes the step of providing operating power to the heating element. When in the automatic mode, the method includes the steps of comparing the pre-set temperature value to the temperature at the cooking unit, sensed by the temperature sensor, and providing operating power to the heating element when the temperature at the cooking unit sensed by the temperature sensor is lower than a value substantially the same as the pre-set temperature value. The method in automatic mode further includes terminating power to the heating element when the temperature at the cooking unit, sensed by the temperature sensor, is substantially the same as the pre-set temperature value. When in the timed mode, the method includes the steps of comparing the pre-set time interval to the actual elapsed time, and providing operating power to the heating element in accordance with the selected mode of operation until the actual elapsed time is substantially equal to the pre-set time interval. The method in timed mode further includes switching to a second mode of operation when the actual elapsed time is substantially equal to the pre-set time interval when in timed mode.

An application-specific integrated circuit is preferably adapted for use in providing operating power and further for use in illuminating indicia, preferably LEDs, corresponding to the mode of operation.

The present invention is directed to a method for operating a slow cooker in at least one of a mode of operation selected from a group of modes including at least one of the manual mode, the automatic mode and the timed mode.

The present invention is also directed to a preferred method for operating a slow cooker, wherein the modes of operation include the manual mode, the automatic mode and the timed mode. The method includes the step of actuating the single control switch a first time to provide a high operating power to the heating element in the manual mode, causing a high LED and power LED to illuminate. Actuating the single control switch a second time provides a high operating power for about four hours in timed mode and illuminates both the high LED and a warm LED. After about four hours, the high LED deactivates and operating power is provided to the heating element when the temperature at the cooking unit is lower than a value substantially the same as the pre-set temperature value in automatic mode. Actuating the single control switch a third time provides a low operating power to the heating element in the manual mode and illuminates a low LED. Actuating the single control switch a fourth time provides a low operating power to the heating element for about eight hours in timed mode and illuminates both the low LED and warm LED. After about eight hours, the low LED deactivates and operating power is provided to the heating element when the temperature at the cooking unit is lower than a value substantially the same as the pre-set temperature value in automatic mode. Actuating the single control switch a fifth time provides operating power to the heating element if the temperature at the cooking unit is lower than a value substantially the same as the pre-set temperature value in the automatic mode and illuminates a warm LED. Actuating the single control switch a sixth time terminates the power to the heating element.

The present invention is further directed to an electronic control circuit for operating a cooking apparatus including a cooking unit and a heating element, and at least one of a temperature sensor and a clock. The electronic control circuit includes a single control switch for turning on operating power to the cooking apparatus and selecting a mode of operation, wherein the mode of operation is selected from a group of modes including at least one of a manual mode, an automatic mode and a timed mode. A manual mode is selected by selecting an operating power level. An automatic mode is selected by selecting a pre-set temperature value, and a timed mode is selected by selecting a pre-set time interval. The electronic control circuit with the automatic mode includes the temperature sensor in thermal contact with the cooking unit and further includes a comparator for comparing the pre-set temperature value to the temperature at the cooking unit, sensed by the temperature sensor, in automatic mode. The electronic control circuit including the timed mode includes the clock for monitoring actual elapsed time, and a means for comparing the actual elapsed time to the pre-set time interval, in the timed mode. The electronic control circuit also includes a means for providing operating power to the device in response to the selected mode of operation and either the selected operating power, the selected pre-set temperature value, or pre-set time interval.

The timed mode of the electronic control circuit includes a first mode of operation, which operates until the actual elapsed time is substantially equal to the pre-set time. In the automatic mode, the operating power is provided to the heating element to substantially achieve the pre-set temperature value, and power is terminated to the heating element when the pre-set temperature value is substantially attained. Further, there are preferably at least two manual modes, a high mode and a low mode.

Preferably, the electronic control circuit of the present invention incorporates an application-specific integrated circuit to provide operating power to the device.

A preferred form of the electronic control circuit, as well as other embodiments, objects and advantages of this invention will be apparent from the following detailed description of the illustrative embodiments thereof, which is to be read in connection with the accompanying drawings.

DETAILED DESCRIPTION OF THE PREFERRED EMBODIMENTS

Figure 1:
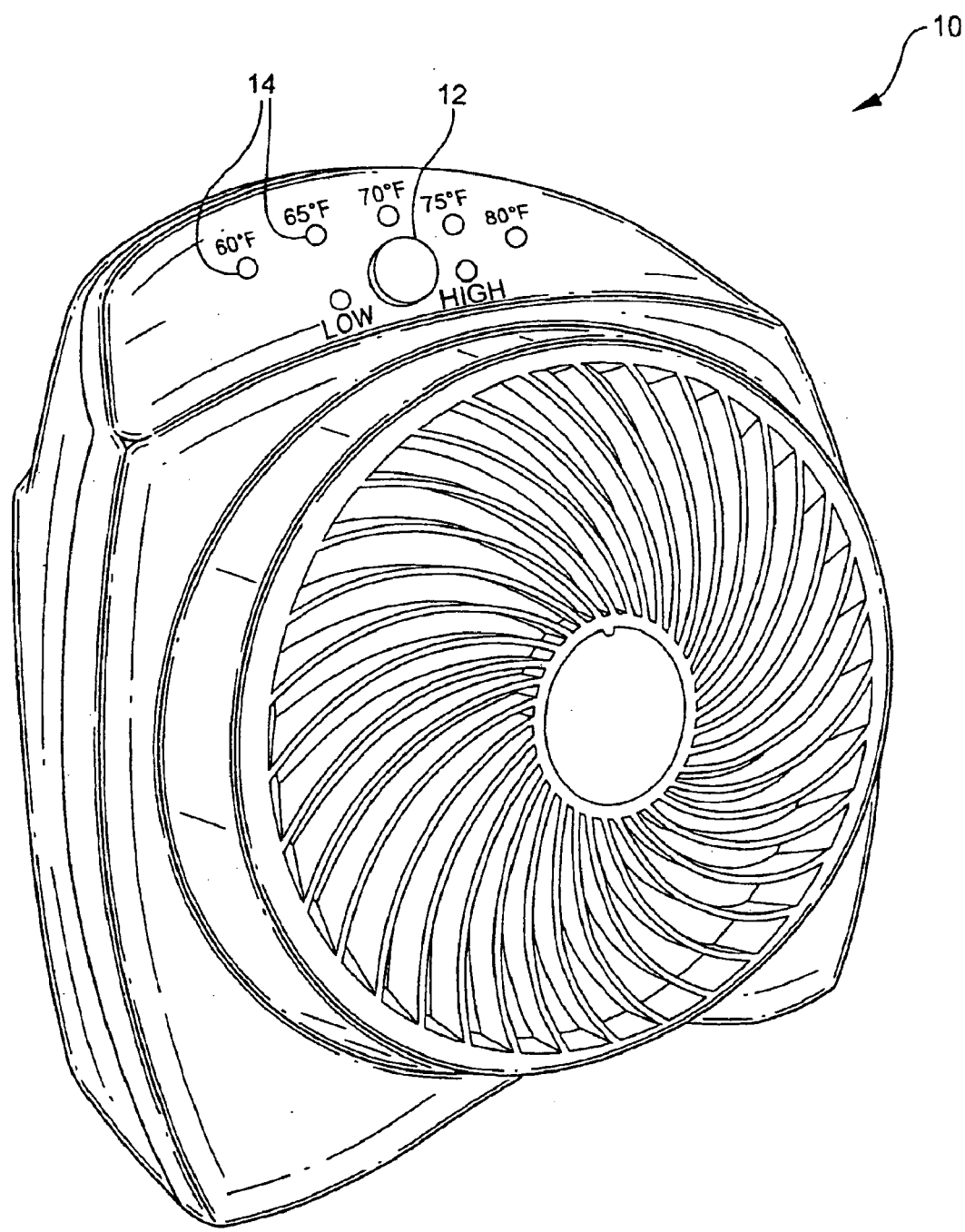
FIG. 1 is a perspective view of a heater including a first embodiment of the electronic control device of the present invention.

Referring to FIG. 1, a heater is shown utilizing a first embodiment of the electronic control device of the present invention. Although FIG. 1 illustrates a heater, it is envisioned that the electronic control circuit of the present invention is equally adaptable to be used in a fan including a thermostat, or a cooking device including a thermostat, or a humidifier including a humidistat. For example, the same device illustrated in FIG. 1 may be operated as a fan with a thermostat by removing the heating element from the unit. A typical structure for a window fan including a thermostat is disclosed in commonly owned U.S. Pat. No. 5,660,605 entitled "Window Fan", the disclosure of which is incorporated herein by reference.

Likewise, a cool mist humidifier may be operated which uses a wick filter and a fan to draw air through the filter to add moisture to the surroundings using a similar electronic control circuit. The structure of a cool mist humidifier is disclosed in commonly owned U.S. Pat. No. 5,529,726 entitled "Evaporative Humidifier", the disclosure of which is incorporated herein by reference. Similarly, the electronic control circuit can be employed in a warm mist humidifier having a humidity sensor. A typical structure for a warm mist humidifier is disclosed in commonly owned U.S. Pat. No. 5,792,390 entitled "Humidifier with Top Fill Tank", the disclosure of which is incorporated herein by reference.

In addition, the electronic control circuit of the present invention is useful in controlling a cooking apparatus, for example an electric skillet or griddle, a slow cooker, a deep fryer, or a roaster oven, which include a heating element and a set temperature value, and optionally, time-sensitive cooking cycles. The structure of a slow cooker, for example, is disclosed in commonly owned U.S. Pat. No. 6,573,483 to DeCobert et al. entitled "Programmable Slow-Cooker Appliance", the disclosure of which is incorporated herein by reference.

The single-button electronic control circuit disclosed herein is capable of operating any type of unit, including a fan, a heater, a humidifier, and a cooking apparatus which requires both power level control and achieving a set temperature. A single-button electronic circuit formed in accordance with the present invention can also operate a unit requiring the additional capability of automatically switching modes of operation after a set time.

The electronic control circuit disclosed herein includes a single switch, namely a push-button switch having a manual and automatic mode of operation, and optionally a timed mode of operation. It is also envisioned that other types of switches can be used; however, a push-button switch allows for easy operation and is low in cost. More specifically, in the manual mode, the device, e.g. a heater, a cooking device, a fan or a humidifier, can be operated at either high, medium, or low power regardless of the ambient temperature in the case of a heater or fan, or housing or cooking unit temperature in the case of a cooking device, or humidity level in the case of a humidifier. Alternatively, the device may be operated in an automatic mode based upon a sensed temperature/humidity and a predetermined threshold temperature or humidity set point or value set by the user. For example, in the case of a heater, the automatic mode may include a temperature set point of 70° F. If the unit is set in automatic mode to 70° F., the heater will operate at a selected power level, until ambient temperature sensed by a thermostat reaches 70° F. Once the set point temperature is attained, the electronic control device of the present invention de-energizes the unit until the sensed temperature once again falls below the set point temperature and the unit is once again turned on.

As noted earlier, the same type of electronic control circuit is equally applicable to a fan equipped with a thermostat, or a humidifier equipped with a humidistat. In addition, an electronic control circuit formed in accordance with the present invention may be incorporated in a cooking apparatus equipped with a thermostat. The cooking apparatus preferably includes a cooking unit or housing in which food is prepared, and further includes a heating element and a temperature sensor, both in thermal contact with the housing. Optionally, the cooking unit is separable and adapted to fit at least partially within a heating unit.

When used in a cooking apparatus in the manual mode, the device preferably includes at least a high and low operating power setting. The high operating power setting is operated at a predetermined power, set by system parameters. The low operating power is preferably set by cycling between 0 and 82% of the wattage of the high operating power setting. The device operates at the selected power setting in manual mode, regardless of the housing temperature of the cooking device. The cooking device may also be operated in an automatic mode based upon a sensed temperature at the housing and a predetermined temperature value set by the user. The available automatic modes preferably include a warm mode, having a temperature set point of about 150° F., to keep food warm. If the unit is set in automatic mode to 150° F., the cooking device will operate at a predetermined power level, until the sensed housing temperature reaches 150° F. Once the set point temperature is attained, the electronic control device of the present invention de-energizes the heating element until the sensed temperature once again falls below the set point temperature, triggering the device to again supply power to the heating element.

Preferably, a device formed in accordance with the present invention for use in a cooking apparatus also includes a timed mode of operation. In the timed mode, the device, a cooking apparatus for example, preferably includes at least one time setting, during which the device operates in a first mode of operation, which may be either a manual mode or an automatic mode. The manual modes preferably include at least a high and low operating power settings. In timed mode, the cooking device operates at the selected power setting in manual mode or at the selected pre-set temperature in automatic mode for the user-selected time. At the conclusion of the user-selected time, the device switches to a second mode of operation. The device may, for example, switch to an automatic mode based upon a sensed temperature at the housing and the pre-set temperature value selected by the user. Preferably, a cooking device switches to an automatic mode, preferably a so-called "warm" mode with a temperature set point of about 150° F., to keep food warm once a manual (e.g., high or low) cooking cycle is completed at the conclusion of the user-selected time interval. Optionally, the device switches to an off mode at the conclusion of the first mode of operation, and power is terminated to the heating element on completion of a timed cooking cycle.

In a preferred embodiment, the selection of a time automatically selects a manual mode of operation as the first mode of operation. For example, a selection of a time setting of 4 hours or less will also select the high manual mode, and a time setting of more than 4 hours will also select the low manual mode as the first mode of operation.

In an alternate embodiment, the timed mode may also include a plurality of discretely incremented pre-set time intervals. The user selects the desired pre-set time interval by stepping through the discrete values available. The pre-set time intervals are preferably set in 1 hour increments. In one embodiment, a user selects the pre-set time interval by subsequent pushes on a push-button switch, whereby each push increments the time interval by one hour, and displays the selected time interval on a digital display on the cooking appliance.

Referring again to FIG. 1, a heater 10 formed in accordance with the present invention includes a push-button switch 12 to operate the electronic control circuit. A series of light-emitting diodes (LEDs) 14 are provided around the periphery of the push-button switch 12 to provide a visual indication as to the mode and setting of operation of the unit. The single push-button switch and associated circuitry replaces the functions of previously used multi-position switches and thermostats/humidistats.

Figure 2:
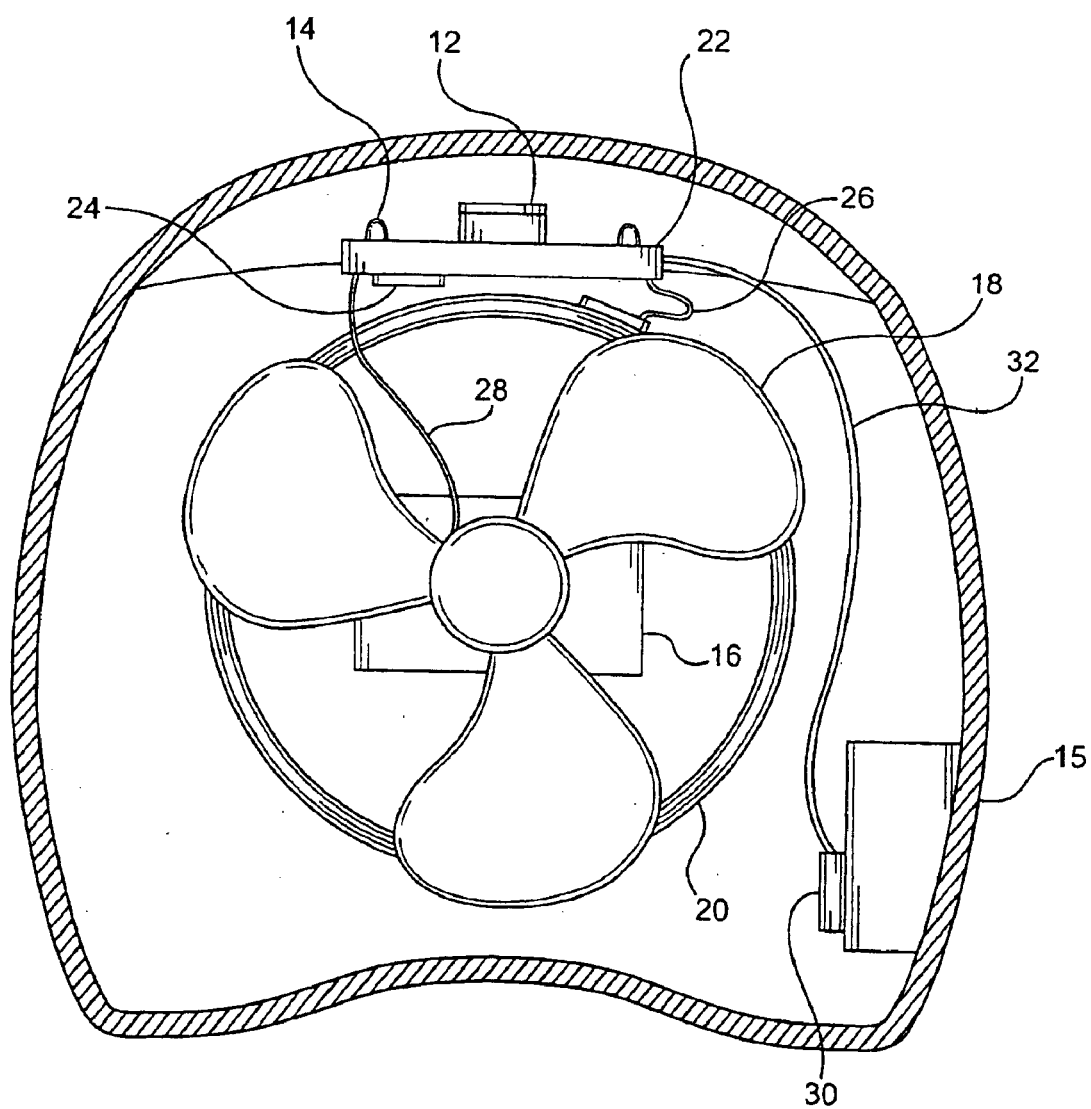
FIG. 2 is a cross-sectional view of the heater illustrated in FIG. 1.

FIG. 2 is a front cross-sectional view of FIG. 1 illustrating the components of the heater 10. The heater includes a heater housing 15 for supporting therein a fan assembly comprising a motor 16 and a fan blade 18. The motor 16 includes a shaft (not shown) which is mechanically connected to the center hub of the fan blade to rotate the blade producing air flow which exists the front grille. It is envisioned that the fan assembly may take any known form so long as air is drawn across the heating element for discharge to the surroundings. The heater 10 also includes a heating element 20 to produce the heated air to be discharged from the unit. In this illustration, the heating element is in the form of a circular element, however, many different types of heating elements may be used as is well known by those of ordinary skill.

The heater 10 uses an electronic control circuit to operate the heating element and fan. As illustrated in FIG. 2, the electronic control circuit is preferably in the form of a printed circuit board 22 having a logic circuit in the form of an application-specific integrated circuit (ASIC) 24 programmed to perform the specific logic of the electronic control circuit to operate the heater. The ASIC 24 is electronically coupled to both the heating element and fan motor via printed traces on the circuit board as well as wires, 26 and 28, respectively. The electronic control circuit also includes a thermostat 30 coupled to the ASIC 24 via wires coupled to the printed circuit board 22. The thermostat 30 senses ambient air temperature and provides the information to the ASIC for comparison to the predetermined threshold temperature set by the user via the push-button switch.

Figure 3:
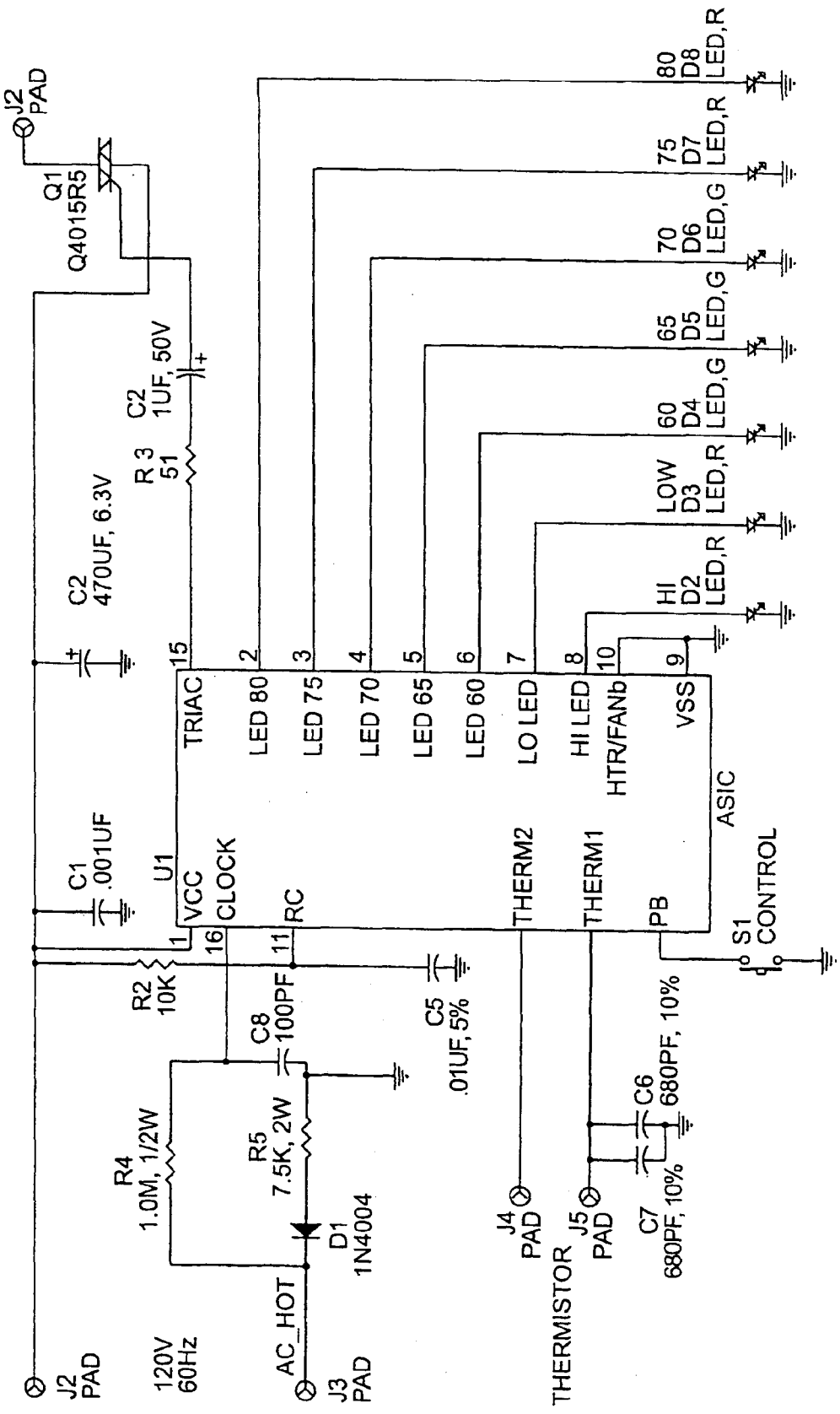
FIG. 3 is an electrical schematic of the electronic control circuit for the heater illustrated in FIGS. 1 and 2.

FIG. 3 illustrates an electronic control circuit for use with the heater. The ASIC U1 is a collection of logic circuits having the specific logic required for operation provided therein. A suitable ASIC is produced by The Holmes Group, Inc., a Massachusetts Corporation under Part No. "Holmes Accutemp ASIC".

Furthermore, the ASIC includes a comparator for comparing the sensed ambient temperature value to the pre-set value selected by the user. In the case of a humidifier, an ASIC according to the present invention includes a comparator for comparing the sensed humidity value to a user-selected humidity value. In the case of cooking devices, the comparator compares the sensed housing or cooking unit temperature of the cooking appliance to the user-selected temperature value.

The electronic control circuit also includes a triac trigger circuit to provide power to the unit being operated. Contrary to a microprocessor which can be programmed to perform a variety of functions, the ASIC is designed to perform specific functions. Accordingly, ASIC's are typically lower in unit costs and provide higher performance by eliminating the circuit from the chip needed to make it programmable and incorporating just those logic functions needed for the application. The higher performance comes from directly implementing the logic instead of using an instruction set requiring multiple clock pulses to execute.

As illustrated in FIG. 3, the heater formed in accordance with the present invention uses a single push-button control switch S1 to control operation of the unit and seven (7) LEDs to indicate the mode of operation. Naturally, other types of control switches and varying numbers of LEDs may be used depending upon the number of modes and settings chosen by the designer. The ASIC U1 uses the input A/C power from a standard 120 volt, 60 Hz outlet to perform timing functions, and to determine when to fire a triac Q1 that controls operation of the heating element and fan assembly. The 60-Hz input may also be used to monitor time in a timed mode of operation. The input power is provided to the electronic control circuit via pads J2 and J3 on the printed circuit board. The hot A/C input is passed through a power supply rectifier which includes components D1 and R5 arranged as shown in FIG. 3. It should be noted that diode D1 is arranged to provide negative voltages to the ASIC U1 at pin 9 labeled VSS. Resistor R5 provides current regulation and resistor R4 provides a sample of the AC line frequency to determine when to fire the triac and for internal timing function. The A/C neutral is provided to the pin 1, VCC, of the ASIC U1. Negative going pulses on pin 15 labeled TRIAC of the ASIC U1 fire the triac Q1. The A/C neutral is also provided to the triac Q1. Capacitor C1 protects the ASIC from transients on the A/C power line. Capacitor C2 acts as a filter capacitor for the power supply to reduce ripple thereon.

The ASIC U1 further includes an internal oscillator, whose frequency is determined by an external RC network, R2 and C5 coupled to pin 11. The RC network is used to generate a higher frequency for operations that require smaller time increments than can be obtained from the input 60 Hz line through pin 16 labeled CLOCK. The electronic control circuit has been engineered to draw a relatively constant current, regardless of the mode of operation. Therefore, no voltage regulation is required. Furthermore, by changing the value of resistor R2, the frequency of the internal oscillator can be changed thereby delaying the firing of the triac in the low power mode of operation. Thus, the ASIC U1 can be used in a wider range of applications.

The electronic control circuit further includes a thermistor T1 coupled to the ASIC U1 via printed circuit board pads J4 and J5. Capacitors C6 and C7 along with thermistor T1, set the frequency of an oscillator inside the ASIC. As the temperature changes the value of thermistor T1, the oscillator frequency changes thus enabling the ASIC to measure temperature.

The ASIC U1 also includes outputs to each of the LED indicators which provide visual indicia as to the mode of operation of the heater. In the circuit shown, two LEDs provide indication of the power level, either high (D2) or low (D3) and the remaining LEDs provide indication as to the predetermined threshold temperature at which the heater will be turned on, i.e., 65° F. through 80° F. in 5° increments, D4–D8, respectively.

As discussed earlier, the ASIC and associated electronic control circuit can be used to operate a heater, a cooking device, a fan or a humidifier. To accomplish this function, the ASIC U1 includes a programming pin that can be tied to either the DC power voltage or ground thereby identifying whether the ASIC is operating a heater or cooking device, or a fan. A similar circuit may be used in a cool mist humidifier by exchanging the thermistor with a humidity sensor.

The ASIC logic also permits the device to be operated in a manual mode, i.e. constant operation at a selected power level, or in an automatic mode using the input from the thermistor to determine if the set threshold temperature has been reached. In automatic mode, if the device is a heater or cooking device, the triac is fired to energize the heating element only when the temperature is below a set temperature. Similarly, if the device is a fan, in automatic mode, the triac is fired to operate the fan only when the temperature is above a set temperature.

Optionally, the ASIC logic also includes operation of the device in a timed mode. In timed mode, the device operates at a selected power setting for the user-selected time, regardless of ambient temperature, in the case of a heater or fan, or housing/cooking unit temperature, in the case of a cooking device. At the conclusion of the user-selected time, the device switches to a different mode of operation. For a cooking apparatus, for example, the device preferably switches to an automatic "warm" mode, most preferably set to a temperature of about 150° F., in order to keep food warm once the timed cooking cycle is complete. Alternatively, in timed mode, a heater, fan, cooking apparatus or humidifier may switch to the power off state after the conclusion of the user-selected time.

Operation of the heater using the push-button switch S1 requires a series of pushes of the switch to proceed through the sequence of options available. When power is first applied to the electronic control circuit by plugging the unit into the wall outlet, an internal power on reset circuit in the ASIC turns off all external signals. The first push of the control button or switch places the heater in manual high power mode lighting the high LED and causing a pulse to fire the triac near the zero crossing of the A/C power. In case of a large fan which has a larger fan motor providing an inductive load, a second pulse is also generated approximately 2.2 msec. after the zero crossing so that the triac can be turned on when enough holding current is present to keep it on.

A second push of the control button places the heater in the manual operation low power level mode thereby lighting the low LED. The triac is fired with a delay sent by the frequency of the RC oscillator as determined by the values of resistor R2 and capacitor C5 to place the unit in the low power mode of operation.

A third push on the control button places the heater in the automatic mode at high power. Specifically, the automatic mode is defined as operating to a predetermined set point and comparing the set temperature with the sensed ambient temperature of the thermistor. This third push lights both the high LED and 80° F. LED and sets a thermostat temperature of 80° F. In this mode, when operating as a heater controller, the triac fires when sensed ambient temperature is below 79° F. thereby supplying power to the heating element and fan motor. The triac does not fire when the ambient temperature is above 81° F. and the heater remains off until the temperature drops below 79° F. If the electronic control circuit were controlling a fan, the triac would be turned on when the sensed ambient temperature rises above the set temperature and turns off when sensed ambient temperature drops below the set temperature. The off and on limits are one degree above and below the set temperature to prevent the unit from cycling on and off repeatedly.

Subsequent pushes of the control button changes the temperature setting in five degree increments as follows: 75° F., 70° F., 65° F., and 60° F. Following the high power level, 60° F. setting, the next push causes the heater to go into the low power level mode and the 80° F. temperature setting. Accordingly, in this setting, the heater operates at low power to achieve and maintain a sensed ambient temperature of 80° F. Thus, the low LED is lit as well as the 80° F. LED. Subsequent pushes of the control button moves the set temperature through the set increments at low power levels until the low power, 60° F. mode is reached. The next push on the control button places the electronic control circuit and the ASIC in the "off" mode and turns off all LEDs and stops firing the triac.

In an alternative embodiment, the ASIC design can be adapted for use in a cooking device. In one embodiment, the control button switch and associated circuitry are modified to include two manual modes, high and low, and at least one automatic mode, namely a warm setting of about 150° F. The first push of the control button or switch places the device in manual high power mode, preferably lighting a high LED and firing the triac as described above. A second push of the control button places the device in the manual low power level mode, preferably lighting a low LED and firing the triac with a delay sent by the frequency of the RC oscillator. A third push on the control button places the cooking device in the automatic mode to operate the device at a predetermined warming temperature, preferably of about 150° F. This third push lights the warm LED and sets a thermostat temperature of 150° F. In the automatic mode, when operating as a heating element controller in a cooking device, the triac fires only when the temperature drops to about 140° F., and stops operating when the temperature reaches about 160° F., in order to maintain a temperature of about 150° F. ±10° F.

In one embodiment, as a matter of convenience, at any time during the setting sequence, if the push button is held down for more than about one (1) second in any mode of operation, the electronic control circuit enters the off mode. When the control button is pushed again, the electronic control circuit and ASIC return to the mode setting that the device was in prior to being turned off.

Furthermore, as discussed above, the electronic control circuit ASIC logic provides for a range of temperature around the set point temperature in which the operation of the unit begins and is terminated. More specifically, in the case of a heater, the sensed ambient temperature must be at least one degree above the set temperature before the unit will shut off. Likewise, the temperature must be at least one degree below the set temperature for the unit to turn on. Otherwise, the unit would turn on and off excessively around the set temperature.

Figure 4:
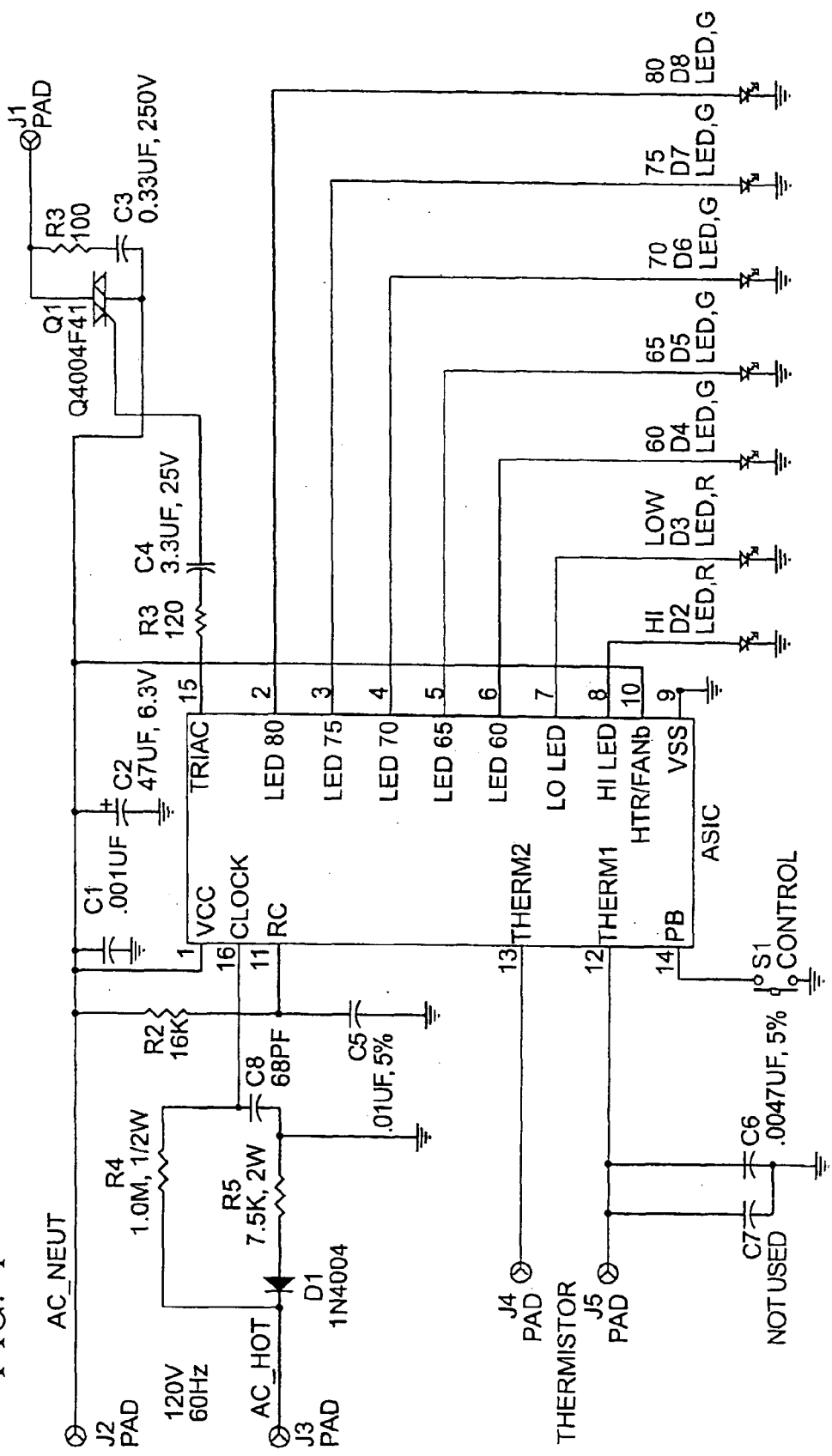
FIG. 4 is an electrical schematic of the electronic control circuit for use with a box fan.

FIG. 4 is an electrical schematic of an electronic control circuit of the present invention for use with a box fan. Like components from the schematic of FIG. 3 have the same reference designations. However, the values for some of the components have been adjusted to be more suitable for use with the inductive load of a fan. For example, capacitor C7 is no longer needed and an RC network including resistor R1 and capacitor C3 has been added in parallel to the firing triac to compensate for the inductive load of the fan. With respect to operation of the box fan, an identical sequence of activations of the push button switch, i.e. control button, yields identical modes of operation. It should also be noted that pin 10 of the ASIC is no longer tied to pin 9 and ground thereby operating the ASIC in the "fan" mode rather than the "heater" mode.

Figure 5:
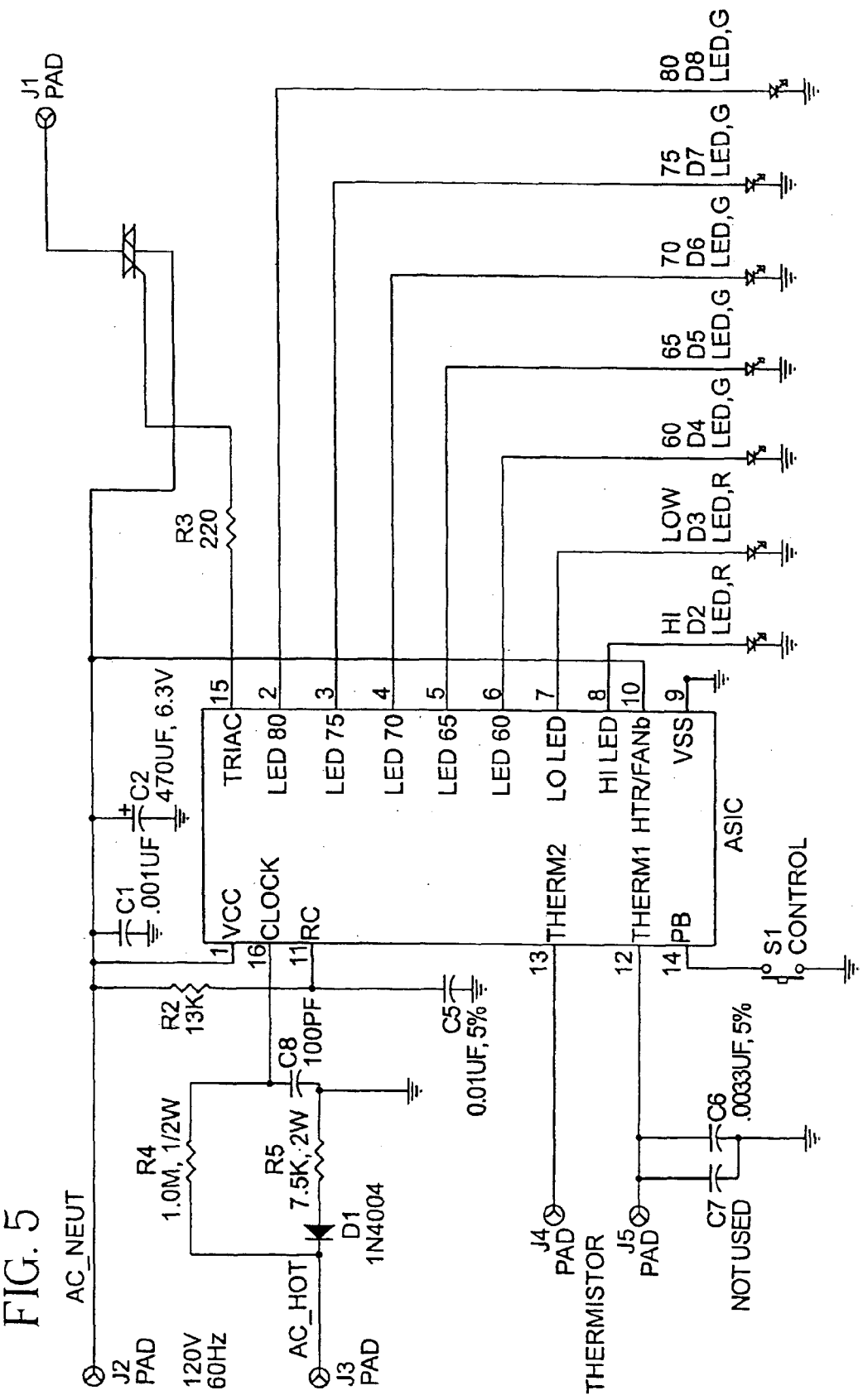
FIG. 5 is an electrical schematic of the electronic control circuit for use with a window fan.

FIG. 5 is an electrical schematic of an electronic control circuit of the present invention for use with a window fan. Once again, like components of different values from FIGS. 3 and 4 have the same reference designation. Since the window fan motor is not a large inductive load, there is no need for the RC network in parallel with the firing triac used in connection with box fan application of the circuit.

Figure 6:
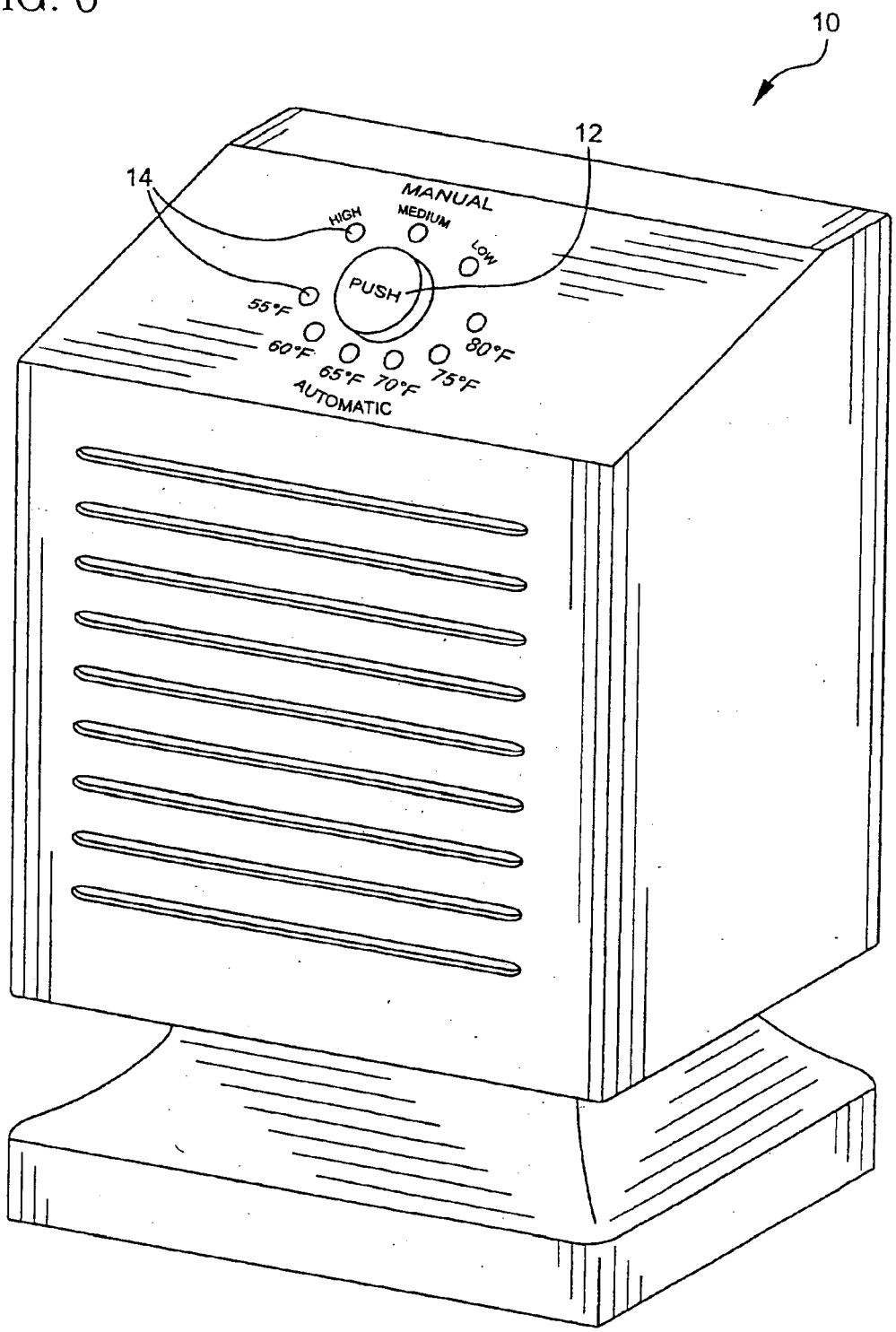
FIG. 6 is an alternative embodiment of the heater formed in accordance with the present invention.
Figure 7:
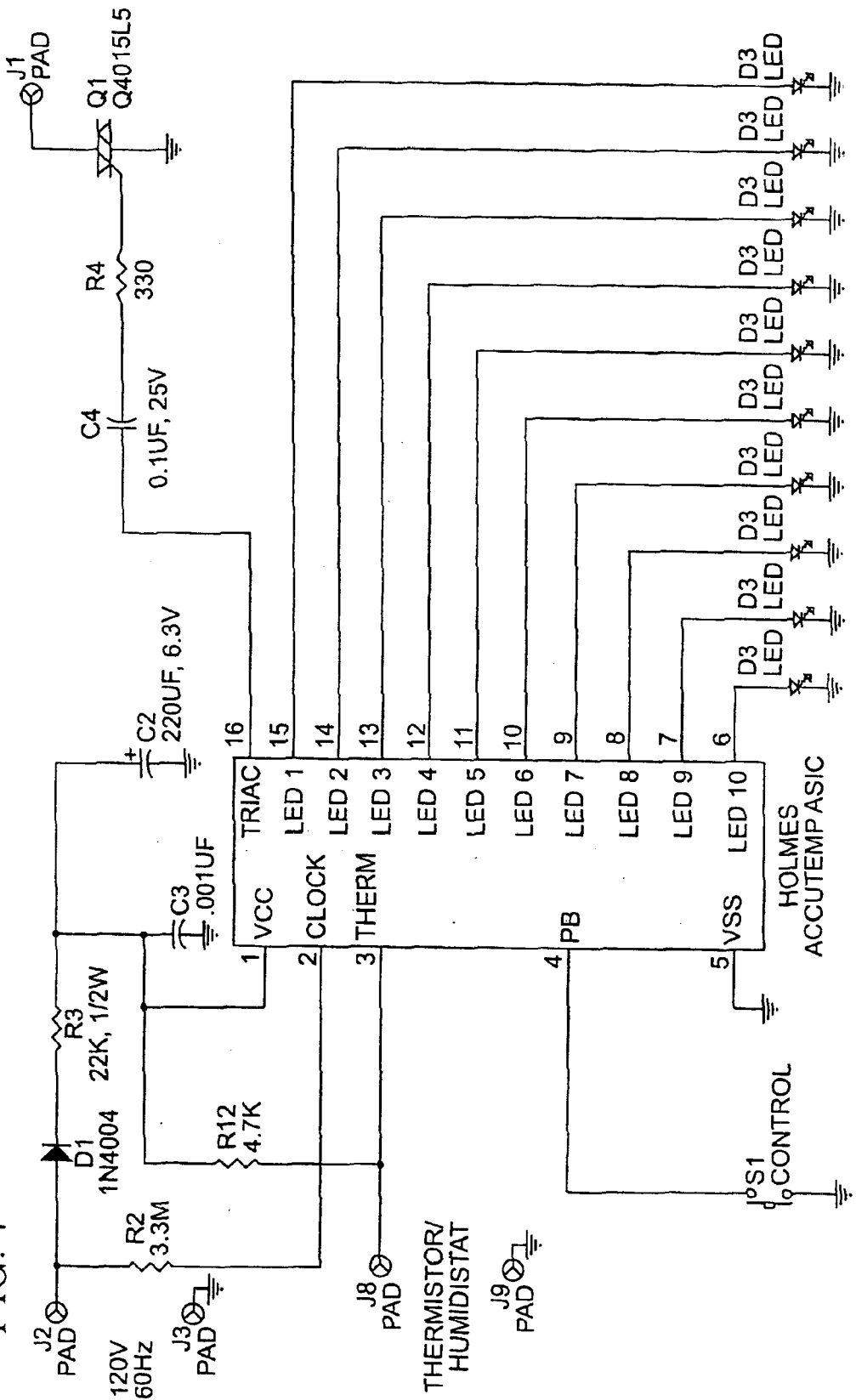
FIG. 7 is an electrical schematic of the electronic control circuit for the heater illustrated in FIG. 6.

FIG. 6 is an alternative embodiment of a heater using the single control switch and electronic control circuit as illustrated in FIG. 7. In this embodiment, the heater has three power level settings, high, medium and low and an additional temperature setting of 55° F. It is contemplated as part of the present invention to have any given number of power level settings as well as any given number of temperature/humidity settings.

The heater illustrated in FIG. 6 having the electronic control circuit shown in FIG. 7 operates by repeated pushing of the push-button through the following sequence of operating conditions:

Originally in "off" position;

First push, provides continuous operation and a high power setting regardless of temperature with the corresponding high LED illuminating;

Second push provides continuous operation at medium power setting regardless of temperature with the corresponding medium LED illuminating;

Third push provides, continuous operation on low power setting regardless of temperature with the corresponding low LED illuminating;

Fourth push provides operation at a predetermined power level when ambient temperature is less than 55° F.; if sensed ambient temperature is greater than 55° F., power to the heating element and fan is terminated until sensed ambient temperature falls below 55° F. Subsequent pushes moves the sequence through the incremented temperature settings until the 80° F. mode is reached. The next push turns unit off.

As illustrated in FIG. 6, the LEDs are preferably individually labeled according to each of the above-identified operating conditions. The appropriate LED is illuminated according to operating conditions of the device.

Although the electronic control circuit may be constructed of discrete logic components, in order to be cost effective and most reliable, the electronic control circuit of the present invention is preferably in the form of a printed circuit board including a microcontroller, and more preferably, in the form of an ASIC.

FIG. 7 is an electrical schematic of the electronic control circuit of an alternative embodiment utilizing an ASIC to achieve the desired functions. In the electrical schematic of FIG. 7, it is assumed that the ASIC includes an analog to digital converter and an internal oscillator. The circuit also uses a voltage regulator D1.

Figure 8:
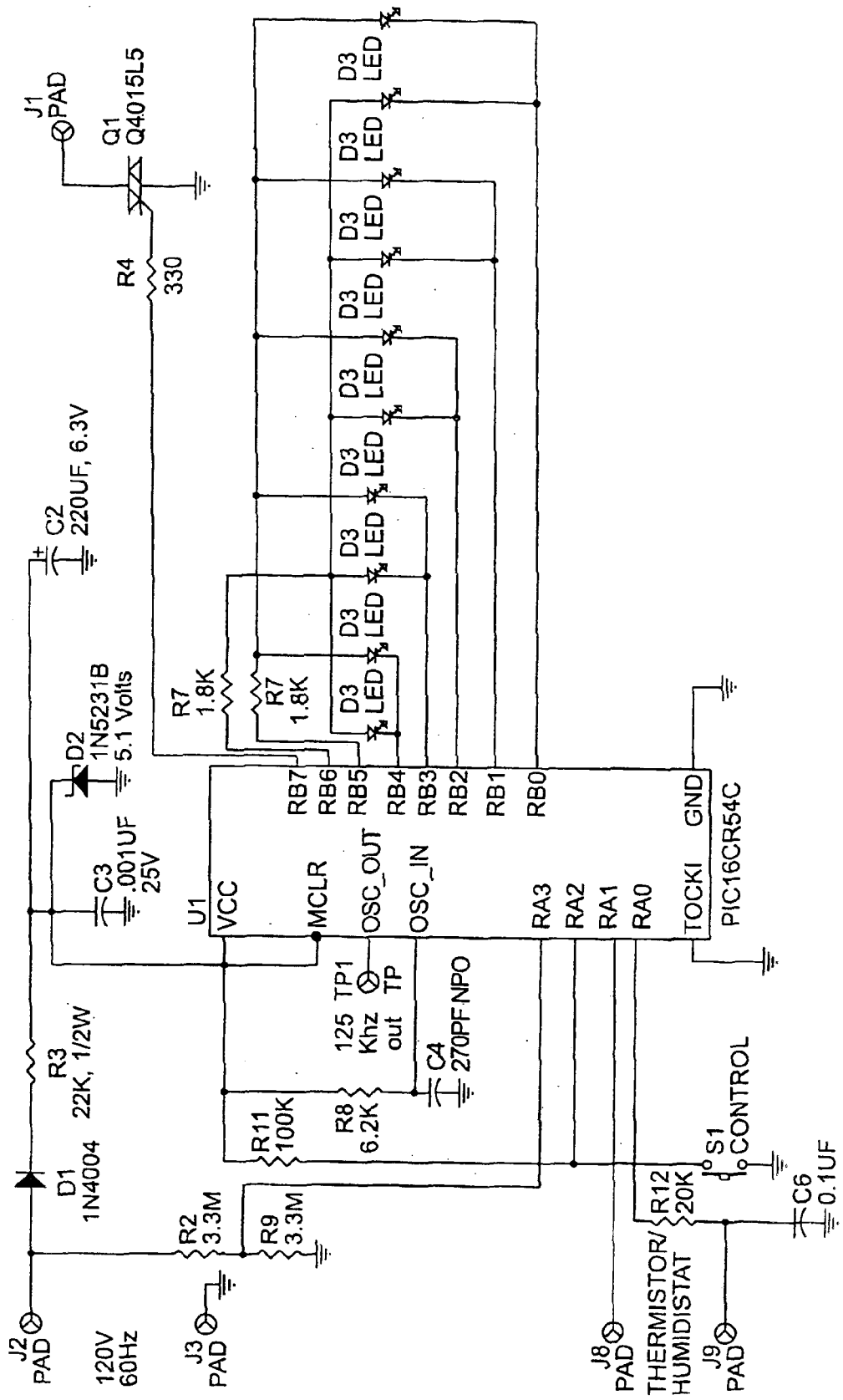
FIG. 8 is an electrical schematic of the electronic control circuit of the present invention utilizing a standard microcontroller.

FIG. 8 illustrates a similar electronic control circuit schematic to that of FIG. 7, except that the circuit utilizes a commonly available microprocessor rather than an ASIC. The circuit of FIG. 8 also includes a thermostat/humidistat sensor for sensing ambient temperature/humidity and a triac trigger circuit to provide power to the unit being operated.

As discussed above, the circuit of FIG. 8 is somewhat more complicated including additional electrical components to achieve the same results as the circuit using the ASIC. However, the operation of the circuit would be similar to that described above with respect to the heater circuits shown in FIGS. 3 and 7.

Figure 9:
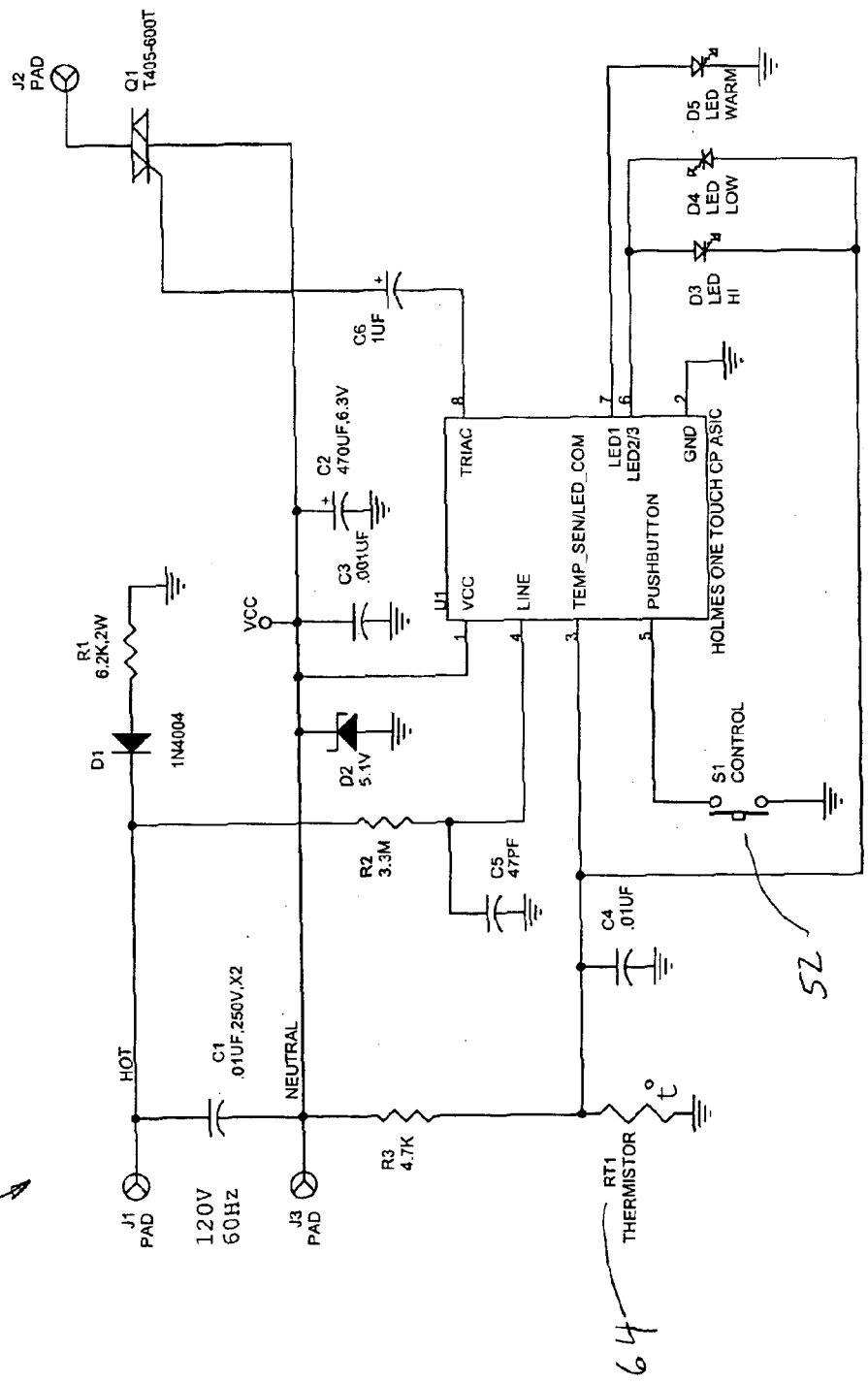
FIG. 9 is an electrical schematic of the electronic control circuit for use with a slow cooker.
Figure 10:
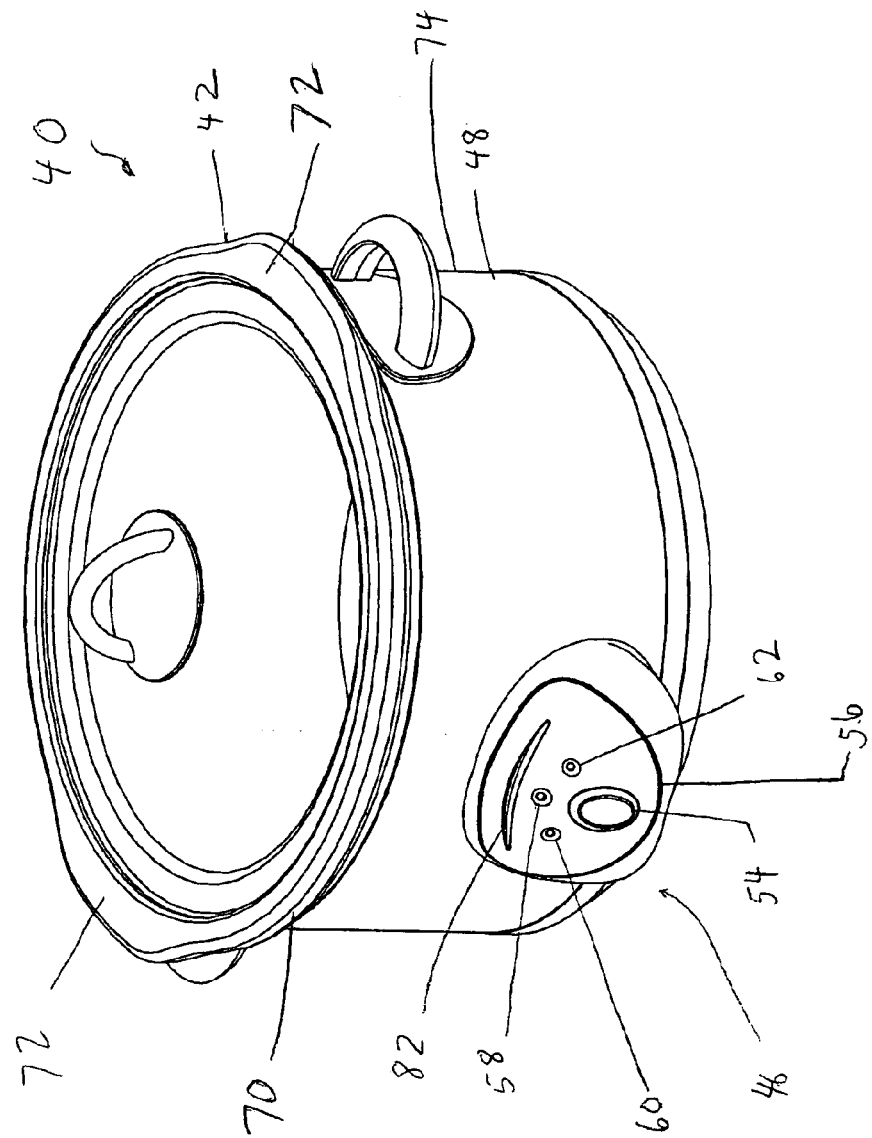
FIG. 10 is a perspective view of a slow cooker which includes an embodiment of the electronic control device of the present invention.
Figure 11:
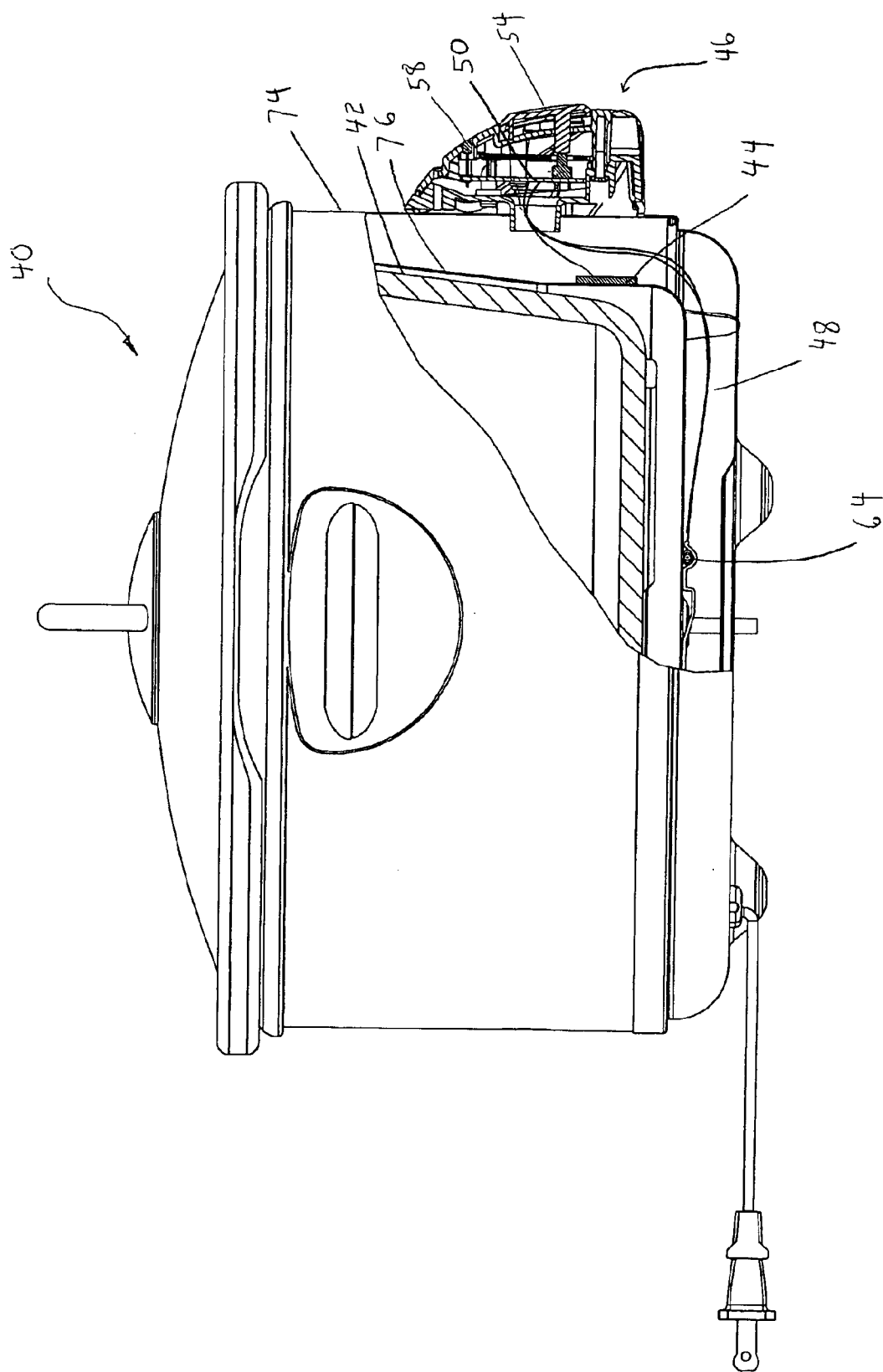
FIG. 11 is a side view with a cutaway showing a cross-section of the slow cooker of FIG. 10.

FIG. 9 illustrates a preferred embodiment of an electronic control circuit 32 for use in a slow cooker 40 shown in FIG. 10. The electronic control circuit 32 operates with two power level settings, an additional "warm" temperature setting, and with time-automated switching from one mode to another. Referring also to FIG. 10 and FIG. 11, a slow cooker 40 incorporating the electronic control circuit 32 of the present invention preferably includes a cooking unit 42 in which food is prepared, a heating element 44 in thermal contact with the cooking unit 42 and a control unit 46. The cooking unit 42 is adapted to fit at least partially within a heating unit 48, which preferably includes the heating element 44. The electronic control circuit 32 is mounted on a printed circuit board 50, and is electrically coupled to the heating element 44 to provide power thereto. Further details of the construction of a slow cooker are provided, for example, in commonly owned U.S. Pat. No. 6,573,483 to DeCobert et al., the disclosure of which is incorporated herein by reference.

Referring to FIGS. 9–12, the electronic control circuit 32 includes a single control switch 52 having a timed mode in addition to a manual and automatic mode of operation. Specifically, the slow cooker 40 operated by the preferred electronic control circuit 32 shown in FIG. 9 has two manual modes preferably corresponding to two power level settings, high and low; an automatic "warm" mode preferably corresponding to a warm temperature setting of about 150° F. The device 40 also has at least two timed modes, four (4) hours and eight (8) hours, corresponding to a power level setting of high and low, respectively. At the completion of a timed cooking cycle, the device switches to the automatic "warm" temperature setting, preferably about 150° F., for an indefinite period of time. In an alternative embodiment, at the completion of a timed cooking cycle, the device may be switched to the power off mode.

Referring still to FIGS. 9–12, a preferred embodiment of the slow cooker 40 having the electronic control circuit 32 illustrated in FIG. 9 operates by repeated pushing of a single push-button 54 which depresses the control switch S1 52 through a sequence of operating conditions. The push-button 54 is located on a control panel 56 located on the front of the device 40. At least three LEDs are provided on the control panel 56 to indicate the mode of operation. Operation of the slow cooker 40 in manual high mode is preferably indicated by a (high) LED 58, and operation in manual low mode is preferably indicated by a (low) LED 60. Operation of the slow cooker in automatic warm mode is preferably represented by a warm LED 62. Operation of the slow cooker 40 using the single push-button 54, and corresponding status of the LEDs through a push-button sequence is as follows, with references to FIG. 10.

When the device 40 is first plugged in, the push-button 54 in FIG. 10 is in the "off" position with no LEDs lit.

The first push illuminates the high LED 58 and provides continuous operation at a high power setting, regardless of temperature, with no time limit (manual mode).

A second push illuminates both the high 58 and warm LED 62, and provides operation at a high power setting, regardless of temperature, for four (4) hours (timed mode). After this four-hour time interval, the high LED 58 switches off leaving just the warm LED 62 illuminated, and the device 40 operates in warm mode, with no time limit, as described below.

The third push illuminates the low LED 60 and provides continuous operation at a low power setting, regardless of temperature, and with no time limit (manual mode).

The fourth push illuminates both the low LED 60 and warm LED 62 and provides continuous operation at a low power setting, regardless of temperature, for eight (8) hours (timed mode). After this eight-hour time, the low LED 60 deactivates and the heater operates in warm mode, with no time limit, as described below.

A fifth push illuminates the warm LED 62 and provides operation in the automatic mode to maintain the temperature, sensed at the housing of the slow cooker 40, at a predetermined temperature preferably of about 150° F. The device is preferably regulated to within 1 or 2° F. of the predetermined temperature. For example, if the predetermined temperature is about 150° F., if the sensed temperature reaches about 151° F., power to the heating element is terminated until the sensed temperature falls to about 149° F. The warm mode operates with no time limit.

A sixth push turns the appliance 40 off and deactivates all LEDs.

In another embodiment of the slow-cooker formed in accordance with the present invention and operation thereof, an automatic warm mode is provided and timed modes are provided. For example, in operation, when the slow cooker is first plugged in, all LEDs are off and no power is applied to the heating element. A first push illuminates the high LED and causes the heating element to operate at a high power setting for a period of about 4 hours (timed mode). After 4 hours, the unit enters the warm (automatic) mode where the temperature is controlled by sensing the temperature of the thermistor.

If the button is pushed a second time, the device operates in a second timed mode, operating at a low power setting to the heating element for a period of about 8 hours. After 8 hours, the unit enters the automatic warm mode.

If the button is pressed a third time, the unit enters the warm mode. A fourth push turns the unit off.

One skilled in the art will recognize that a large variation of timed, manual, and automatic modes may be encompassed in a cooking apparatus formed in accordance with the present invention.

In the electronic control circuit for a slow cooker, pre-programmed time settings, e.g. 4, 6 and 8 hours, use the 60 Hz line input to clock internal digital counters. The ASIC logic of FIG. 9 uses the 60 Hz line input to clock the timed mode cycles and to determine when to fire a triac Q1. The ASIC U1 switches to the automatic warm mode at the conclusion of a timed mode.

For operation in the automatic mode, the ASIC U1 includes a comparator that compares the sensed housing or cooking unit temperature to the user-selected temperature value, which is nominally 150° F. in the slow cooker operated by the circuit 32 shown in FIG. 9. A thermistor RTI 64 is in thermal contact with the cooking unit 42 to sense the operating temperature of the device 40. The thermistor RTI 64 may be placed, for example, in direct contact with the cooking unit 42, by using a spring-loaded device, for example, to maintain contact, or in a liner of the heating unit 48, which at least partially houses the cooking unit 42. In the embodiment shown in FIG. 11, the thermistor RTI 64 is attached to a bottom wall of the heating unit 48.

The resistivity of thermistor RTI 64, which varies as a function of temperature, provides a voltage at pin 3 of the ASIC U1. The triac Q1 then fires to operate the heating element in the cooking device only when the sensed temperature drops below the pre-set temperature value. The triac Q1 stops firing once the sensed temperature increases a few degrees above the pre-set temperature value.

In the embodiment shown in FIG. 9, the electronic circuitry supporting the ASIC U1 is similar to that used in the electronic control circuit for a heater, shown in FIGS. 3 and 7. The triac Q1 applies power to the heating element in accordance with the mode of operation selected. For example, in a low (manual) mode, the triac Q1 may apply power to the heating element for 2.24 seconds out of a 3.2 second interval for a 70% duty cycle.

In the warm (automatic) mode, the power is controlled by sensing the temperature of the thermistor RT1 64 in FIG. 9, and applying full power if the voltage corresponding to the sensed temperature is below a preset voltage on the TEMP_SEN pin. The power is terminated if the voltage is above the preset voltage on TEMP_SEN. The thermistor RT1 64 is preferably a negative coefficient device, so that its resistance drops as temperature increases. The voltage divider consisting of R3, which is connected to VCC and RT1, therefore, provides a voltage to the ASIC U1, which is a measure of the thermistor temperature.

Because the ASIC U1 uses a 60 Hz clock, less power is consumed if the true is turned on by pulsing the gate. A capacitor, C6, is preferably used to couple the drive signal to the triac Q1 and also to determine the gate signal pulse width. The TRIAC pin (pin 8) of the triac Q1 shown in FIG. 9 is a bi-directional pin. The output section is a current limited open drain pull-down device and a current limited pull-up device. The input section is a Schmitt trigger device with a fixed threshold. The triac Q1 is pulsed on by bringing the TRIAC pin low with the pull-down device, causing current to be delivered to the gate. The current also begins charging C6 whose positive terminal is being held high by the action of the triac gate to the MTI terminal tied to VCC.

As the capacitor charges, the voltage on the TRIAC pin drops. When the voltage reaches the Schmitt trigger threshold, the pull-down device is turned off by internal ASIC circuitry to terminate the pulse and the pull-up device is turned on to discharge the capacitor in preparation for the next cycle.

Because it is desirable to limit the number of pins on the ASIC to eight, the TEMP_SEN/LED_COM pin is preferably used to both sense temperature and illuminate the high and low LEDs. In high mode, the HI LED is turned on by pulling the LED2/3 pin high through a current limited pull-up device while pulling down the TEMP_SEN/LED_COM pin. Similarly, in low mode, the LOW LED is illuminated by pulling the LED2/3 pin low and the TEMP_SEN/LED_COM pin high. In warm mode, all drive is preferably removed from the LED2/3 pin so the TEMP_SEN/LED_COM pin can be used as an input to sense temperature.

Capacitors C1, C3, C4 and C5 are used in the circuit shown in FIG. 9 to reduce noise spikes that could reset or damage the ASIC U1.

The added timed mode of operation in FIG. 9 is encompassed within the logic of the ASIC U1. Though only two timed settings, followed by a "warm" mode, are represented by the circuit 32 of FIG. 9, the ASIC formed in accordance with the present invention can be programmed to include more choices of operating time, and more variation in the choice of timed mode sequences. The supporting circuitry, including the number and/or arrangement of LEDs or other indicia would be altered accordingly. In addition, a digital word and/or number display may be added to facilitate a selection of the operating mode and/or time interval from a plurality of pre-set time intervals or identification of food to be cooked. For example, the circuitry may be provided with a look-up table to automatically set a time and temperature based upon the identification of the food to be cooked in the cooking apparatus. Furthermore, it is contemplated that the single-button electronic control circuit disclosed herein is capable of operating any type of appliance which requires power control, maintenance of one or more operating parameters such as temperature and/or humidity, and also, which benefits from time-automated switching of modes of operation.

The electrical components and values illustrated in FIGS. 3, 4, 5, 7, 8 and 9 are provided for illustrative purposes only.

It is contemplated that other components arranged in a different manner can accomplish the functions attained in the present invention and fall within the scope thereof.

Figure 12:
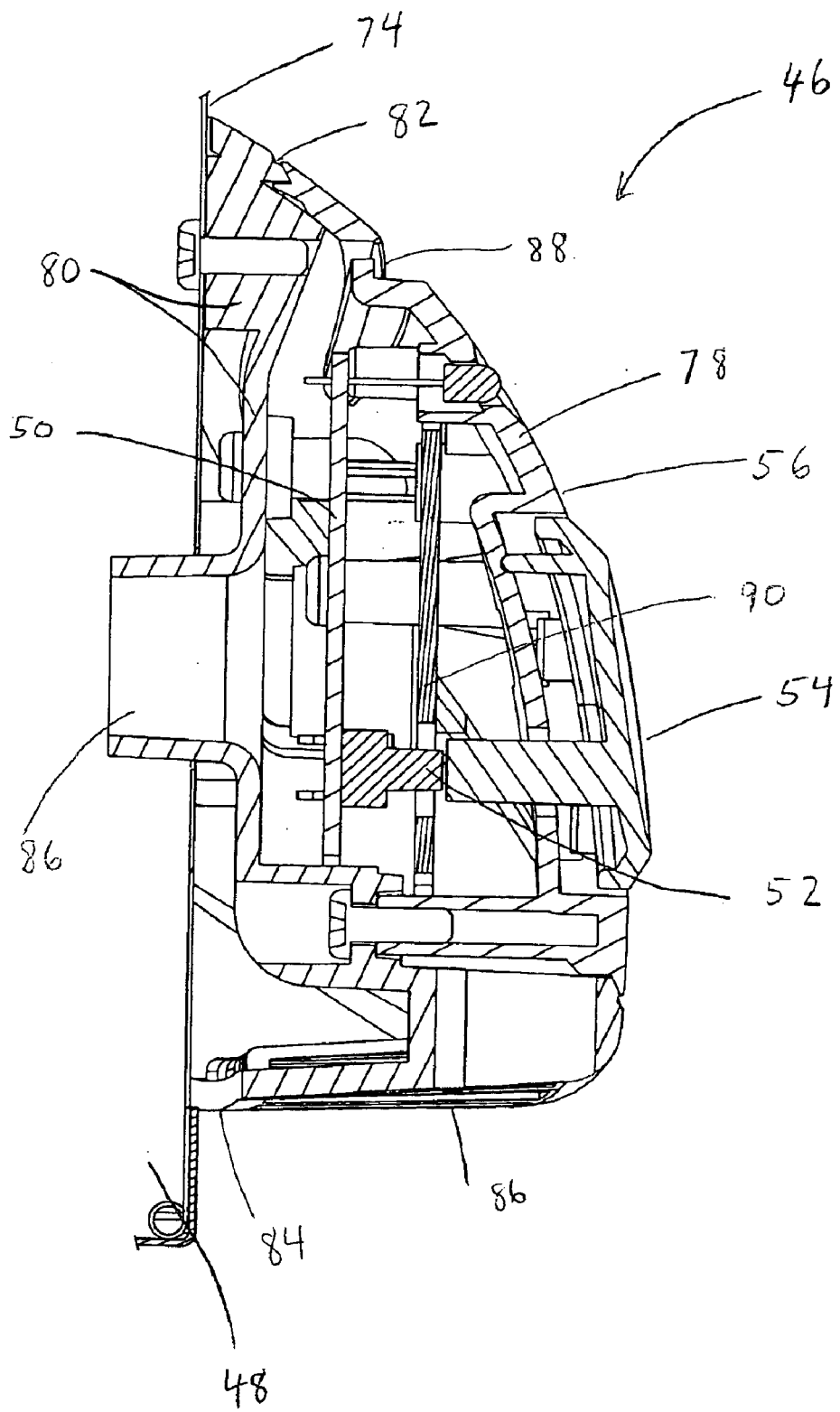
FIG. 12 is an enlarged view of the cross-section through the control unit of the slow cooker shown in FIG. 10.

The preferred embodiment of a slow cooker 40 formed in accordance with the present invention is shown in FIGS. 10–12, and includes the electronic control circuit 32 shown schematically in FIG. 9. Referring again to FIG. 10, the cooking unit 42 is preferably made of ceramic with a coating of conventional glazing compound. The cooking unit 42 is adapted to be at least partially received within the heating unit 48 with an annular lip 70 of the heating unit 48 supporting the cooking unit 42 as shown.

Preferably, the annular lip 70 further defines a pair of handle portions 72 to facilitate lifting the cooking unit 42. In one embodiment, the cooking unit 42 has a substantially oval cross-section. In another embodiment as shown in FIG. 10, the cooking unit 42 has a substantially circular cross-section. The heating unit 48 is shaped to complement and support the cooking unit 42.

As shown in FIG. 11, the heating element 44 is preferably mounted to the heating unit 48, and is preferably positioned between an outer sidewall 74 and an inner sidewall 76. Most preferably, the heating element 44 is mounted to the inner sidewall 76 as shown. Referring also to FIG. 12, the control unit 46 preferably includes a circuit board housing 78, a control panel 56, and an insulation shield 80 assembled together for attachment to the outer sidewall 74 of the heating unit 48. Preferably, the housing 78 and insulation shield 80 are made from a thermoplastic material such as polypropylene. The interior of the housing 78 contains the printed circuit board 50, which includes the electronic control circuit 32 shown in FIG. 9.

The control panel 56 provides user interface and is preferably located on an inclined front surface of the housing 78, as best seen in FIG. 10. The inclined front surface gives the user access to the control panel 56, and also locates the controls and electrical components within the housing 78 away from a significant amount of the heat generated by the appliance 40.

The control panel 56 of the preferred embodiment of the slow cooker 40 shown in FIGS. 10–12 includes a plurality of indicator lights, such as LEDs. As is well-known in the art, a variety of other indicator devices may be provided, including digital readouts, audible alarms, liquid crystal displays, incandescent lamps or fluorescent readouts. A water-impermeable label membrane may be applied over the front of the control panel 56 to label the indicators for the user. The membrane may also protect the front of the control panel 56 from damage from spilled foods or liquids and facilitate cleaning.

Referring to FIG. 12, to further protect the electronic components within the housing 78 from the heat generated by the appliance 40, the annular shield member 80 is preferably sized for interposition between the heating unit 48 and the housing 78. The shield 80 acts as a ventilated spacer to hold the electronic components and the housing 78 at a distance away from sidewall of the cooking unit 42.

In order to dissipate heat that may otherwise be retained between the heating unit 48 and the rear of the housing 78, an air circulation space is provided within the shield 80 to vent warmer air out through an upper elongated slot 82. An additional slot 84 may also be provided, preferably along the bottom of the control unit 46. Heated air may thus escape through the top elongated slot 82 and cooler air may enter the air circulation space through the bottom elongated slot 84. The shield 80 also preferably defines a rearwardly projecting cylindrical flange 86 that extends into the outer wall 74 to allow passage of control and power wiring between the interior of the heating unit 48 and the interior of the housing 78.

In a similar fashion, air circulation is promoted through the housing 78 through a set of openings, preferably defined between the upper portion and the bottom of the housing 78. In particular, a plurality of openings 86 is defined within the bottom wall of the housing 78. An elongated upper slot 88 is provided on the control panel 56 on the front of the housing 78. This allows air to freely circulate behind the control panel 56 and assists in the dissipation of heat from the circuit board 50, including the electronic control circuit 32, within the housing 78. Preferably, a heat sink 90 is positioned between the circuit board 50 and the control panel 56 inside the housing 78. The heat sink 90 preferably includes a plurality of openings defined therein to allow air to circulate between the openings 86 and 88 and through and around the heat sink 90 to dissipate additional heat therefrom.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A cooking apparatus comprising:
   a cooking unit, for holding food;
   a heating element in thermal contact with the cooking unit; and
   an electronic control circuit electrically coupled to the heating element, and adapted to provide power thereto, the electronic control circuit comprising:
   a single control switch to turn on operating power to the cooking apparatus and to select a mode of operation from a group of modes comprising at least one of a timed mode, a manual mode, and an automatic mode, wherein the single control switch selects one of a plurality of predetermined power levels of operation in manual mode, wherein the single control switch further selects a pre-set time interval in timed mode, and wherein the single control switch further selects a pre-set temperature value in automatic mode; and
   at least one of a temperature sensor and a clock, the temperature sensor sensing a temperature at the cooking unit, the temperature sensor being in thermal contact with the cooking unit; and
   wherein the clock monitors and compares actual elapsed time to the pre-set time interval in timed mode, the timed mode including a first mode of operation, the first mode of operation operating until the actual elapsed time is substantially equal to the pre-set time interval, and a second mode of operation, the second mode of operation commencing when the actual elapsed time is substantially equal to the pre-set time interval.

2. The cooking apparatus as defined in claim 1, the group of modes comprising at least the automatic mode, the apparatus further comprising:
   the temperature sensor for sensing the temperature at the cooking unit; and
   means for comparing the pre-set temperature value to the temperature at the cooking unit, sensed by the temperature sensor, the electronic control circuit in automatic mode providing power to the heating element to substantially achieve the pre-set temperature value and terminating power to the heating element when the pre-set temperature value is substantially attained.

3. The cooking apparatus as defined in claim 1, wherein the first mode of operation comprises one of the manual mode and the automatic mode, and the second mode of operation comprises one of the manual mode, the automatic mode, and a power off mode, the power off mode terminating power to the heating element.

4. The cooking apparatus as defined in claim 1, further including indicia corresponding to each mode of operation.

5. The cooking apparatus as defined in claim 4, wherein the indicia are light emitting diodes.

6. The cooking apparatus as defined in claim 1, the group of modes comprising at least the timed mode and the manual mode, wherein the plurality of pre-determined power levels of operation in manual mode include at least high and low.

7. The cooking apparatus as defined in claim 2, wherein the second mode of operation is a warm mode, the warm mode being the automatic mode.

8. The cooking apparatus as defined in claim 7, wherein the pre-set temperature value is 150 degrees Fahrenheit.

9. The cooking apparatus as defined in claim 1, wherein the second mode of operation is a power off mode, the electronic control circuit in power off mode terminating power to the heating element.

10. The cooking apparatus as defined in claim 2, the group of modes comprising the timed mode, the manual mode and the automatic mode, wherein the plurality of pre-determined power levels of operation in manual mode include at least high mode and low mode, further wherein the automatic mode includes a warm mode, further wherein the first mode of operation in timed mode is one of the high mode operating for a first pre-set time interval and low mode operating for a second pre-set time interval, and wherein the second mode of operation is the warm mode.

11. The cooking apparatus as defined in claim 10, further including indicia corresponding to each mode of operation, wherein the indicia include three light emitting diodes (LED), a warm LED indicating the warm mode, a high LED indicating the high mode, and a low LED indicating the low mode, wherein the warm LED stays lit when the apparatus is operated in warm mode, the high LED stays lit when the apparatus is operated in high mode, the low LED stays lit when the apparatus is operated in low mode, the high LED and the warm LED stay lit during the first mode of operation in timed mode for the first pre-set time interval, the low LED and the warm LED stay lit during the first mode of operation for the second pre-set time interval, and only the warm LED stays lit during the second mode of operation in timed mode.

12. The cooking apparatus as defined in claim 10, further comprising a heating unit, the cooking unit being adapted to fit at least partially within the heating unit, wherein the cooking apparatus is a slow cooker.

13. The cooking apparatus as defined in claim 10, wherein the first pre-set time interval is four hours and the second pre-set time interval is eight hours.

14. The cooking apparatus as defined in claim 1, wherein the electronic control circuit includes a plurality of discretely incremented pre-set time intervals.

15. The cooking apparatus as defined in claim 1, wherein the single control switch is a push-button switch.

16. The cooking apparatus as defined in claim 2, wherein the means for comparing comprises a comparator circuit.

17. The cooking apparatus as defined in claim 2, wherein the temperature sensor is a thermistor.

18. The cooking apparatus as defined in claim 1, wherein the clock comprises a timing circuit including a resistor to sample a 120-V 60-Hz AC line signal.

19. The cooking apparatus as defined in claim 1, wherein the electronic control circuit includes an application-specific integrated circuit to control power to the heating element and illuminate indicia associated with the mode of operation selected.

20. The cooking apparatus as defined in claim 2, wherein the electronic control circuit includes a plurality of discretely incremented pre-set temperature values.

21. The cooking apparatus as defined in claim 1, wherein the cooking apparatus is one of an electric griddle, a deep fryer, a roaster oven, and a slow cooker.

22. A method of operating a cooking apparatus, the cooking apparatus comprising a cooking unit, a heating element in thermal contact with the cooking unit, and an electronic control circuit electrically coupled to the heating element and adapted to provide power thereto, the electronic control circuit further comprising a single control switch, and at least one of a temperature sensor for sensing a temperature at the cooking unit and a clock for measuring actual elapsed time, the temperature sensor being in thermal contact with the cooking unit, the method comprising the steps of:

actuating the single control switch to turn the cooking apparatus on and off and to select a mode of operation from a group of modes comprising at least one of a timed mode, a manual mode and an automatic mode, wherein actuating the single control switch in the manual mode selects an operating power level, wherein actuating the single control switch in the automatic mode selects a pre-set temperature value and wherein actuating the single control switch in timed mode selects a pre-set time interval and a first mode of operation, the first mode of operation being selected from one of an operating power level for manual mode of operation and a pre-set temperature value for automatic mode of operation;

providing operating power to the heating element when in the manual mode;

comparing the pre-set temperature value to the temperature at the cooking unit, sensed by the temperature sensor, when in the automatic mode;

providing operating power to the heating element if the temperature at the cooking unit, sensed by the temperature sensor, is lower than a value substantially the same as the pre-set temperature value when in the automatic mode; and terminating power to the heating element when the temperature at the cooking unit, sensed by the temperature sensor, is substantially the same as the pre-set temperature value when in the automatic mode;

comparing the pre-set time interval to the actual elapsed time when in timed mode;

providing operating power to the heating element in accordance with the one of the operating power level for manual mode of operation and the pre-set temperature value for automatic mode of operation until the actual elapsed time is substantially equal to the pre-set time interval when in timed mode; and switching to a second mode of operation when the actual elapsed time is substantially equal to the pre-set time interval when in timed mode.

23. The method of operating a cooking apparatus, as defined by claim 22, wherein the single control switch is a push-button switch and the step of actuating includes repeatedly pushing the push-button switch to progress through the modes of operation and pre-set temperature values and pre-set time intervals.

24. The method of operating a cooking apparatus, as defined by claim 22, wherein the cooking apparatus is operated as a slow cooker.

25. The method of operating a cooking apparatus, as defined by claim 22, wherein the cooking apparatus is one of an electric griddle, a roaster oven, and a deep fryer.

26. The method of operating a cooking apparatus, as defined by claim 22, wherein the means for providing operating power comprises an application-specific integrated circuit.

27. The method of operating a cooking apparatus, as defined by claim 22, the electronic control circuit comprising the temperature sensor and the clock, the group of modes comprising the timed mode and the automatic mode, further wherein the second mode of operation is a warm mode, the warm mode being the automatic mode operating at the pre-set temperature value.

28. The method of operating a cooking apparatus as defined by claim 27, wherein the pre-set temperature value is 150° F.

29. The method of operating a cooking apparatus, as defined by claim 22, the electronic control circuit comprising the clock, the group of modes comprising the timed mode, wherein the pre-set time interval is selected from a plurality of discretely incremented pre-set time intervals.

30. The method of operating a cooking apparatus, as defined by claim 29, wherein the pre-set time interval selected from the plurality of discretely incremented pre-set time intervals is displayed on a digital display.

31. The method of operating a cooking apparatus, as defined by claim 22, wherein the operating power level in manual mode is selected from the o group comprising high and low.

32. The method of operating a cooking apparatus, as defined by claim 22, wherein the cooking apparatus is a slow cooker, the electronic control circuit comprising the temperature sensor and the clock, the group of modes comprising the timed mode, the manual mode and the automatic mode, and further, wherein:

actuating the single control switch a first time provides a high operating power to the heating element in the manual mode and illuminates a high LED;

actuating the single control switch a second time provides a high operating power for about four hours in timed mode and illuminates both the high LED and a warm LED, and after about four hours, deactivates the high LED and provides operating power to the heating element if the temperature at the cooking unit is lower than a value substantially the same as the pre-set temperature value in automatic mode;

actuating the single control switch a third time provides a low operating power to the heating element in the manual mode, and illuminates a low LED;

actuating the single control switch a fourth time provides a low operating power to the heating element for about eight hours in timed mode and illuminates both the low LED and warm LED, and after eight hours, deactivates the low LED and provides operating power to the heating element if the temperature at the cooking unit is lower than a value substantially the same as the pre-set temperature value in automatic mode;

actuating the single control switch a fifth time provides operating power to the heating element if the temperature at the cooking unit is lower than a value substantially the same as the pre-set temperature value in the automatic mode and illuminates a warm LED; and actuating the single control switch a sixth time terminates the power to the heating element and deactivates the warm LED, the high LED and the low LED.

33. An electronic control circuit for operating a cooking apparatus including a cooking unit and heating element comprising:

a single control switch for turning on operating power to the cooking apparatus and selecting a mode of operation from a group of modes comprising at least one of a manual mode and an automatic mode and a timed mode;

means for providing operating power to the device in response to the selected mode of operation and one of a selected operating power, a pre-set temperature value, a pre-set time interval; and at least one of a temperature sensor in thermal contact with the cooking unit and a clock for monitoring actual elapsed time and for comparing actual elapsed time to the pre-set time interval in the at least one timed mode;

wherein the manual mode is selected by selecting the operating power level, further wherein the automatic mode is selected by selecting the pre-set temperature value, and wherein the timed mode is selected by selecting the pre-set time interval.

34. The electronic control circuit defined in claim 33, the mode of operation being selected from the group comprising at least the automatic mode, the electronic control circuit comprising:

the temperature sensor; and a comparator for comparing the pre-set temperature value to the temperature at the cooking unit, sensed by the temperature sensor, in the at least one automatic mode.

35. The electronic control circuit defined in claim 34, the mode of operation being selected from the group comprising the manual mode, the automatic mode and the timed mode, wherein the timed mode includes a first mode of operation, the first mode of operation operating until the actual elapsed time is substantially equal to the pre-set time interval, and a second mode of operation, the second mode of operation commencing when the actual elapsed time is substantially equal to the pre-set time interval, further wherein the first mode of operation is one of the automatic mode and the manual mode, and the second mode of operation is one of the automatic mode and the manual mode, and a power off mode, the power off mode terminating power to the heating element.

36. The electronic control circuit defined in claim 34, wherein in the automatic mode, the means for providing operating power to the heating element provides power to the heating element to substantially achieve the pre-set temperature value and terminates power to the heating element when the pre-set temperature value is substantially attained.

37. The electronic control circuit defined in claim 33, wherein the manual mode includes at least a high mode and a low mode.

38. The electronic control circuit defined in claim 33, wherein the means for providing operating power comprises an application-specific integrated circuit.

* * * * *